United States Patent
Mochida et al.

(10) Patent No.: US 6,467,678 B2
(45) Date of Patent: Oct. 22, 2002

(54) WIRE BONDING METHOD AND APPARATUS

(75) Inventors: Tooru Mochida, Higashiyamato; Tatsunari Mii, Tachikawa; Nobuaki Hirai, Akishima, all of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 106 days.

(21) Appl. No.: 09/750,544

(22) Filed: Dec. 28, 2000

(65) Prior Publication Data

US 2001/0004991 A1 Jun. 28, 2001

(30) Foreign Application Priority Data

Dec. 28, 1999 (JP) ............................................ 11-372637

(51) Int. Cl.⁷ ........................ B23K 31/00; B23K 31/12; B23K 37/10; B23Q 15/10
(52) U.S. Cl. ..................... 228/180.5; 228/103; 228/4.5; 228/9
(58) Field of Search .............................. 228/180.5, 102, 228/103, 4.5, 9, 904; 219/85.18; 73/1.79, 1.81

(56) References Cited

U.S. PATENT DOCUMENTS

| | | | | | |
|---|---|---|---|---|---|
| 4,422,568 A | * | 12/1983 | Elles et al. | .................. | 228/111 |
| 4,771,930 A | * | 9/1988 | Gillotti et al. | ................ | 228/1.1 |
| 4,925,083 A | * | 5/1990 | Farassat et al. | .............. | 228/102 |
| 5,176,310 A | * | 1/1993 | Akiyama et al. | ......... | 228/180.5 |
| 5,326,015 A | * | 7/1994 | Weaver et al. | ............... | 228/102 |
| 5,591,920 A | * | 1/1997 | Price et al. | ................... | 228/4.5 |
| 5,653,380 A | * | 8/1997 | Haji | ......................... | 228/180.5 |
| 6,041,995 A | * | 3/2000 | Takahashi et al. | ........ | 228/141.1 |
| 6,179,197 B1 | * | 1/2001 | Toner | .......................... | 228/102 |

FOREIGN PATENT DOCUMENTS

| | | | | |
|---|---|---|---|---|
| JP | S57-87143 | | 5/1982 | |
| JP | 401033940 A | * | 2/1989 | ........... H01L/21/60 |
| JP | H1-26531 | | 5/1989 | |

* cited by examiner

Primary Examiner—Tom Dunn
Assistant Examiner—Colleen Cooke
(74) Attorney, Agent, or Firm—Koda & Androlia

(57) ABSTRACT

A wire bonding method and apparatus, in which after the tail of a wire extends out of a capillary, the capillary moves to a measurement position above a tail length measuring member; the capillary descends so that the end of the tail contacts the tail length measuring member; a position of the capillary or a distance by which the capillary is lowered at the time that electrical continuity is established with the tail length measuring member is detected; and the tail length is calculated based upon a height level of the tail length measuring member, the position of the capillary before being lowered for measuring the tail, and the position of the capillary when the wire contacts the tail length measuring member, or upon the height of the capillary above the tail length measuring member before lowering the capillary for measuring the tail, and a distance the capillary is lowered.

10 Claims, 4 Drawing Sheets

WIRE BONDING METHOD AND APPARATUS

BACKGROUND OF THE INVENTION

1. Field of the Invention

The present invention relates to a wire bonding method and apparatus for connecting a first bonding point and a second bonding point with a wire, and more particularly to a tail setting method and apparatus in such a wire bonding method and apparatus.

2. Prior Art

Various types of wire bonding methods have been proposed. FIG. 5 shows the most common method.

In FIG. 5, first, in step (a), a ball 2a is formed by the discharge of an electric torch 3 on a wire 2 that extends out of the lower end of the capillary 1. Afterward, the electric torch 3 is moved in the direction indicated by arrow. Next, in step (b), the capillary 1 is moved to a point above the first bonding point 4a of a semiconductor chip 4. Then, in step (c), the capillary 1 is lowered, and the ball 2a on the tip end of the wire 2 is bonded to the first bonding point 4a.

Afterward, in step (d), the capillary 1 is raised. Then, in step (e), the capillary 1 is moved to a point above the second bonding point 5a of a lead 5. Next, in step (f), the capillary 1 is lowered, and the wire 2 is bonded to the second bonding point 5a. Subsequently, after the capillary 1 has been raised to a fixed position, a damper 6 is closed, and the capillary 1 and damper 6 are raised together so that the wire 2 is cut from the root portion of the second bonding point 5a in step (g), thus causing a tail 2b to be formed at the lower end of the capillary 1.

As a result, one wire connection is completed.

Japanese Patent Application Laid-Open (Kokai) Nos. S57-87143 and H1-26531 disclose wire bonding methods of the type described above. In Japanese Patent Application Laid-Open (Kokai) No. S57-87143, the capillary is moved along an upwardly rounded arc trajectory at the uppermost point of the movement of the capillary between the first bonding point and the second bonding point. In Japanese Patent Application Laid-Open (Kokai) No. H1-26531, after the bonding to the first bonding point, the capillary is moved above the first bonding point and toward the second bonding point along an arc trajectory, and then bonding is made to the second bonding point.

The above-described operation in which the wire 2 is cut from the root portion of the second bonding point 5a is accomplished as a result of the damper 6 that is closed at an intermediate point during the upward movement of the capillary 1 and is raised together with the capillary 1. Accordingly, if there is a variation in the amount of opening of the damper 6 depending on the respective dampers 6 attached to the wire bonding apparatus, there will be a time discrepancy at which the damper 6 is closed to clamp or hold the wire 2, even if the timing at which the clamping or holding of the wire 2 is initiated for the purpose of cutting the wire 2 as described above is the same. Consequently, the length of the tail 2b will vary. This will be described in more detail with reference to FIG. 6.

In FIG. 6, the diameter of the wire 2 is, for example, 30 $\mu$m, and the opening and closing control per 1 $\mu$m of movement of the damper 6 is accomplished by output control at, for example, 0.025 ms. In addition, in FIG. 6, amount of opening of a certain clamper 6A is 80 $\mu$m, and the amount of opening of another damper 6B is 60 $\mu$m. The amount of closing in a case where the damper 6A whose amount of opening is 80 $\mu$m holds a wire 2 that has a diameter of 30 $\mu$m is (80−30)=50 $\mu$m. Accordingly, the clamping time TA is as follows: TA=50 $\mu$m×0.025 ms/$\mu$m= 1.25 ms. The amount of closing in a case where the damper 6B whose amount of opening is 60 $\mu$m holds a wire 2 that has a diameter of 30 $\mu$m is (60−30)=30 $\mu$m; accordingly, the clamping time TB in this case is as follows: TB=30 $\mu$m×0.025 ms/$\mu$m=0.75 ms. In other words, the damper 6B holds the wire 2 earlier than the damper 6A by a time of Tb=(1.25−0.75)=0.5 ms.

In order to obtain a length of the tail 2b (tail length) of 360 $\mu$m, it is sufficient in the case of the damper 6A to initiate the clamping operation at a time of 1.25 ms prior to the time that the capillary 1 reaches 360 $\mu$m during the rise of the capillary 1 from the step (f) in FIG. 5. However, if the clamping operation is similarly initiated 1.25 ms in advance for the damper 6B, the position (timing) at which the wire 2 is held or clamped by the damper 6B will be advanced by Tb=0.5 ms, so that the tail length is shortened. For example, in a case where the capillary 1 performs a constant-speed operation at a speed of 72 $\mu$m/ms (7.2 $\mu$m/pulse), the damper 6B is shortened by a length of 72 ($\mu$m/ms)×0.5 ms=36 $\mu$m. In other words, assuming that the tail length LA of the damper 6A is 360 $\mu$m, the tail length LB of the damper 6B is 360−36=324 $\mu$m.

In cases where the damper 6 is, for instance, replaced, it is necessary to adjust the closing timing of the damper 6 (6A or 6B) in the process from the step (f) to step (g) of FIG. 5 in accordance with the amount of opening of the damper 6 (6A or 6B). Conventionally, the following two methods have been used for this. In the first method, the capillary 1 is stopped in a position in which the capillary 1 has been raised by an amount equal to the tail length; then, after the damper 6 is closed, the capillary 1 is again raised. In the second method, the speed at which the damper 6 is raised is slowed beginning at a point immediately prior to a tail position of a specified length, so that the amount of variation in the tail length is reduced.

In the above-described methods, a stopping operation or low-speed operation is performed. Accordingly, the bonding cycle is slowed, and the productivity drops. Furthermore, in the above-described description, the speed at which the capillary 1 is raised is assumed to be 72 $\mu$m/ms; in actuality, however, this speed is set at 360 to 720 $\mu$m/ms in order to increase the productivity, so that it is desirable that the tail length be stable even under such high-speed conditions.

SUMMARY OF THE INVENTION

The object of the present invention is to provide a wire bonding method and apparatus which eliminates differences between individual dampers and obtains a stable tail length without lowering the speed for raising a capillary.

The above object is accomplished by unique steps taken in a wire bonding method in which a wire is bonded to a second bonding point, a capillary is raised by a specified amount, then a damper is closed and said capillary and said damper are raised together so that the wire is cut from the root portion of the second bonding point, thus causing a tail of the wire used for forming a ball to extend from the lower end of the capillary; and in the present invention, the capillary is moved to a measurement position above a tail length measuring member after the tail has been extended, the capillary is then lowered so that the tip end of the tail contacts the tail length measuring member, and the position of the capillary or the distance by which the capillary has been lowered, at the time that electrical continuity is established with the tail length measuring member, is detected, and the tail length is calculated based upon:
(a) the height level of the tail length measuring member, the position of the capillary prior to the lowering of said capillary for the purpose of tail measurement, and the position of the capillary at the time that the wire contacts the tail length measuring member, or from
(b) the height of the capillary above the tail length measuring member prior to the lowering movement of the capillary for the purpose of tail measurement, and the distance by which the capillary is lowered.

In the above, the tail length measuring member is an electric torch which is used to form a ball on the tail, or a semiconductor chip.

Furthermore, in the present invention, the tail length is calculated by the abovedescribed method, and the clamp timing of the damper is corrected on the basis of the results of this calculation.

Furthermore, the correction of the clamp timing of the damper is performed according to:
the speed at which the capillary is raised at the time that the capillary is raised following bonding to the second bonding point, and
the difference between the measured tail length and a reference tail length.

The above object is accomplished by a unique structure for a wire bonding apparatus in which a wire is bonded to a second bonding point, a capillary is raised by a specified amount, then a damper is closed, and said capillary and said damper are raised together so that the wire is cut from the root portion of the second bonding point, thus causing a tail of the wire used for forming a ball to extend from the lower end of the capillary; and the unique structure of the present invention comprises:

a micro-voltage application circuit which applies a micro-voltage to the wire, a contact detection section which outputs a detection signal when the capillary from which the tail has been extended is moved to a measurement position above a tail length measuring member and is then lowered so that the tip end of the tail contacts the tail length measuring member, and a computer which calculates the tail length based upon:
(a) the height level of the tail length measuring member, the position of the capillary prior to the lowering of said capillary for the purpose of tail measurement, and the position of the capillary at the time that the wire contacts the tail length measuring member, or
(b) the height of the capillary above the tail length measuring member prior to the lowering movement of the capillary for the purpose of tail measurement, and the distance by which the capillary is lowered.

In the above structure, the tail length measuring member is an electric torch which is used to form a ball on the tail, or a semiconductor chip.

In addition, the computer calculates the tail length and corrects the clamp timing of the damper on the basis of the results of this calculation.

Furthermore, the correction of the clamp timing of the damper by the computer is performed according to:
the speed at which the capillary is raised at the time that the capillary is raised following bonding to the second bonding point, and
the difference between the measured tail length and a reference tail length.

DETAILED DESCRIPTION OF THE INVENTION

Figure 1:
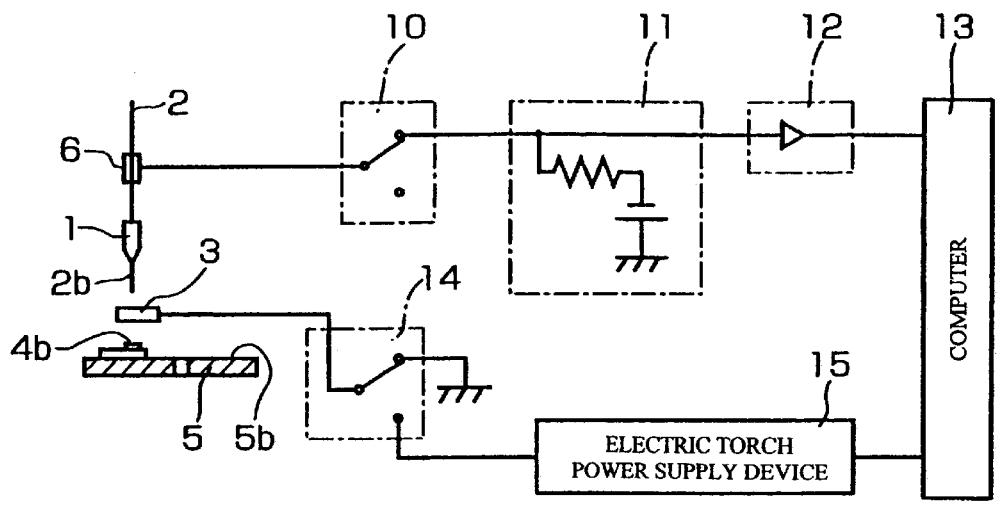
FIG. 1 is an explanatory diagram which illustrates one embodiment of the wire bonding apparatus of the present invention.

One embodiment of the present invention will be described with reference to FIGS. 1 through 3. Furthermore, elements which are the same as in those in FIGS. 5 and 6, or which correspond to those in FIGS. 5 and 6, will be labeled with the same reference numerals.

As shown in FIG. 1, a micro-voltage application circuit 11 is connected to a damper 6 via a switch 10, and this micro-voltage application circuit 11 is connected to the operational control part of a computer 13 via a contact detection section 12. An electric torch 3 is connected to an electric torch power supply device 15 via a switch 14, and this electric torch power supply device 15 is connected to the computer 13.

Figure 2:
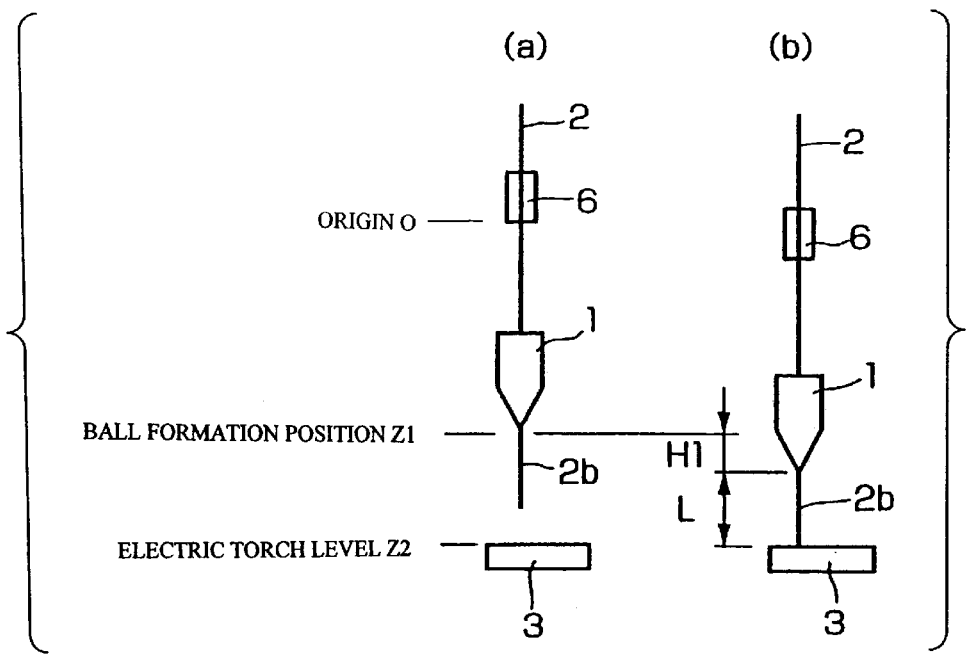
FIG. 2 shows the steps according to one embodiment of the tail length measurement method of the present invention.
Figure 5:
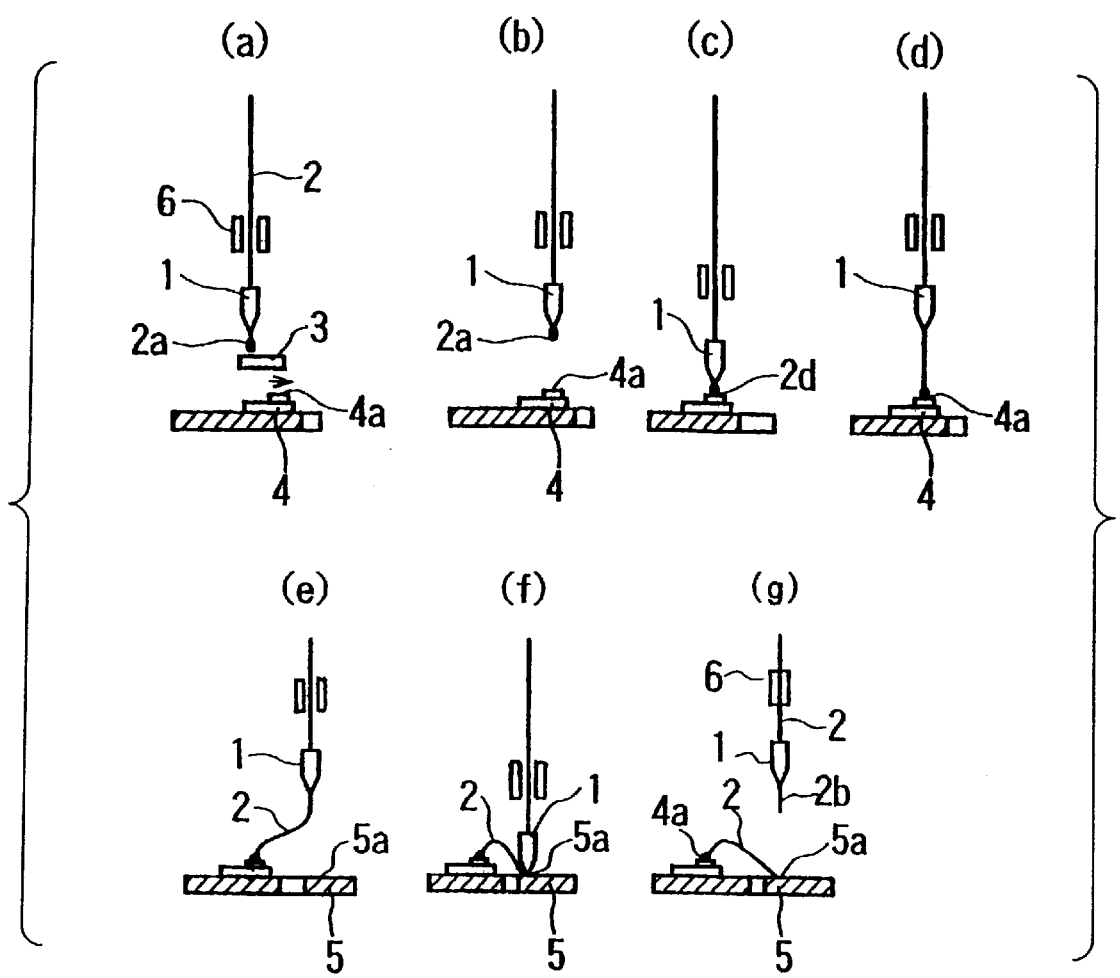
FIG. 5 shows steps of prior art wire bonding method.

Accordingly, so as to adjust the closing timing of the damper 6, after the tail 2b is formed by steps (a) through (g) of FIG. 5, the capillary 1 is moved in the X and Y directions and the vertical (Z) direction, so that the capillary 1 is positioned in the ball formation position Z1 above the electric torch 3 as in step (a) of FIG. 2. The ball formation position Z1 of the capillary 1 and the electric torch level Z2 are stored beforehand in the memory of the computer 13. Next, the switch 10 is switched to the micro-voltage application circuit 11, and the switch 14 is switched to ground, so that the micro-voltage of the micro-voltage application circuit 11 is applied to the wire 2 via the damper 6.

When a tail length measurement start button (not shown) is pressed in this state, the capillary 1 is lowered one pulse at a time in accordance with a command from the computer 13. Then, when the tip end of the tail 2b contacts the electric torch 3 in step (b) of FIG. 2, the micro-voltage application circuit 11 is connected to ground via the damper 6, wire 2, electric torch 3 and switch 14; accordingly, the contact detection section 12 detects the fact that the tip end of the tail 2b has contacted the electric torch 3. The lowering of the capillary 1 is stopped by the detection signal of this contact detection section 12, and the distance Hi by which the capillary 1 has been lowered is stored in the memory of the computer 13. Then, the operation memory (not shown) of the computer 13 calculates the tail length L according to Equation 1.

$$L = |(Z2-Z1)| - H1 \qquad \text{Equation 1:}$$

Figure 3:
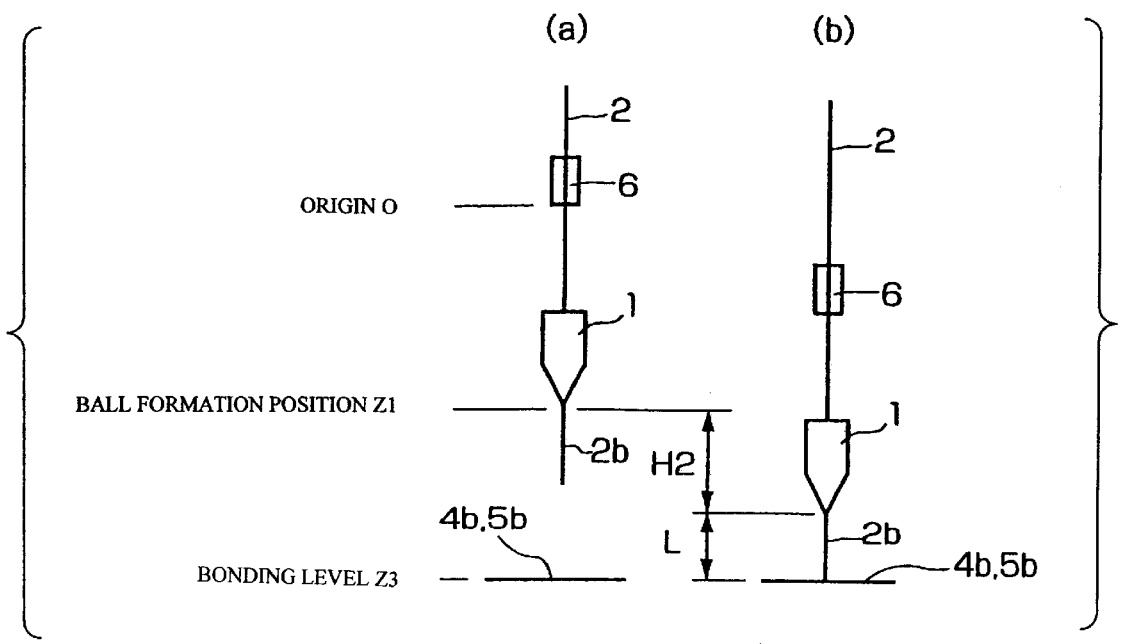
FIG. 3 shows the steps according to another embodiment of the tail length measurement method of the present invention.

FIG. 3 illustrates another embodiment of the present invention.

In the embodiment shown in FIG. 2, the electric torch 3 is to measure the tail length. The embodiment in FIG. 3 uses the bonding surface 4b of the semiconductor chip 4 or bonding surface 5b of the lead 5 shown in FIG. 5 to measure the tail length. In this case, the bonding surface 4b or 5b is grounded. Furthermore, the bonding level Z3 of the bonding surface 4b or 5b is stored beforehand in the memory of the computer 13.

In step (a) of FIG. 3, the capillary 1 is positioned in the ball formation position Z1 above the electric torch 3 in the same manner as in the embodiment of FIG. 2. Next, the switch 10 is switched to the micro-voltage application circuit 11, so that the micro-voltage of the micro-voltage application circuit 11 is applied to the wire 2 via the damper 6. When the tail length measurement start button (not shown) is pressed, the capillary 1 is lowered one pulse at a time in accordance with a command from the computer 13. Then, when the tip end of the tail 2b contacts the bonding surface 4b or 5b in step (b) of FIG. 3, the micro-voltage application circuit 11 is connected to ground via the damper 6, wire 2 and bonding surface 4b or 5b. Accordingly, the contact detection section 12 detects the fact that the tip end of the tail 2b has contacted the bonding surface 4b or 5b. The lowering of the capillary 1 is stopped by the detection signal of this contact detection section 12, and the distance H2 by which the capillary 1 has been lowered is stored in the memory of the computer 13. Then, the operation memory of the computer 13 calculates the tail length L according to Equation 2:

$$L=|(Z3-Z1)-H2| \quad \text{Equation 2:}$$

When the length L of the tail 2b is measured by the above-described methods, if the measured length is not the reference (specific) tail length, the timing (position) at which the wire 2 is clamped by the damper 6 is automatically corrected by the computer 13, so that the tail length is controlled to the reference tail length. The method used to accomplish this will be described next.

The speed at which the capillary 1 is raised when the capillary 1 is raised in steps (f) and (g) of FIG. 5 is inputted beforehand into the computer 13, and operational control is performed by the operational control part of the computer 13 with the position obtained by adding the difference of the tail length from the reference tail length to the reference wire clamping position as a target, so that this is made the position at which the wire 2 is actually clamped.

Figure 4:
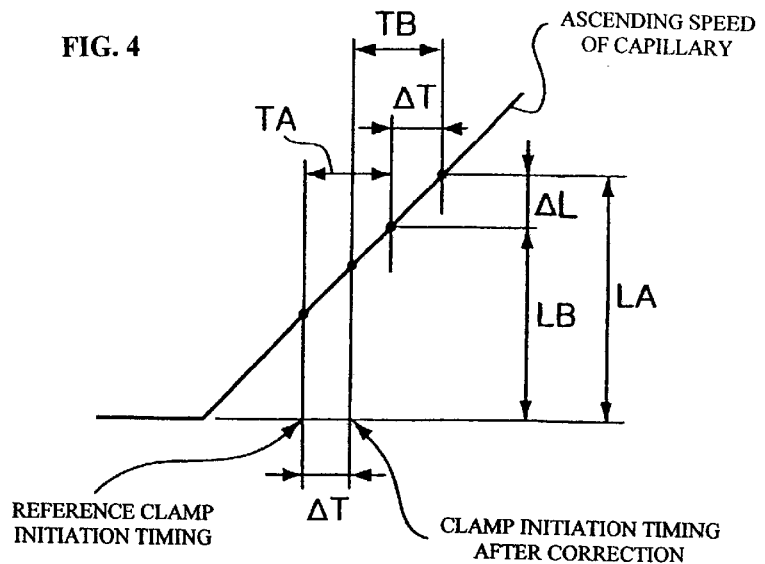
FIG. 4 is an explanatory diagram showing the correction of the clamp initiation timing of the clamper.

As shown in FIG. 4, the tail length LA ($\mu$m) in the case of the damper 6A is the reference tail length; and in the case of the damper 6A, the difference of the tail length determined by measuring the tail length by the above-described method is designated as $\Delta L$ ($\mu$m). The speed at which the capillary 1 is raised is designated as S ($\mu$m/ms). In the case of the damper 6B, the clamping by the damper 6B can be initiated at a point that is delayed (higher) by an amount equal to $\Delta L$ ($\mu$m). Accordingly, the clamp initiation correction time $\Delta T$ is expressed as $\Delta T=\Delta L \div S$. More specifically, the computer 13 compares the tail length measured by the above-described method with the reference tail length and corrects the timing at which the clamping by the damper 6B is initiated. As a result, the reference tail length is obtained.

Figure 6:
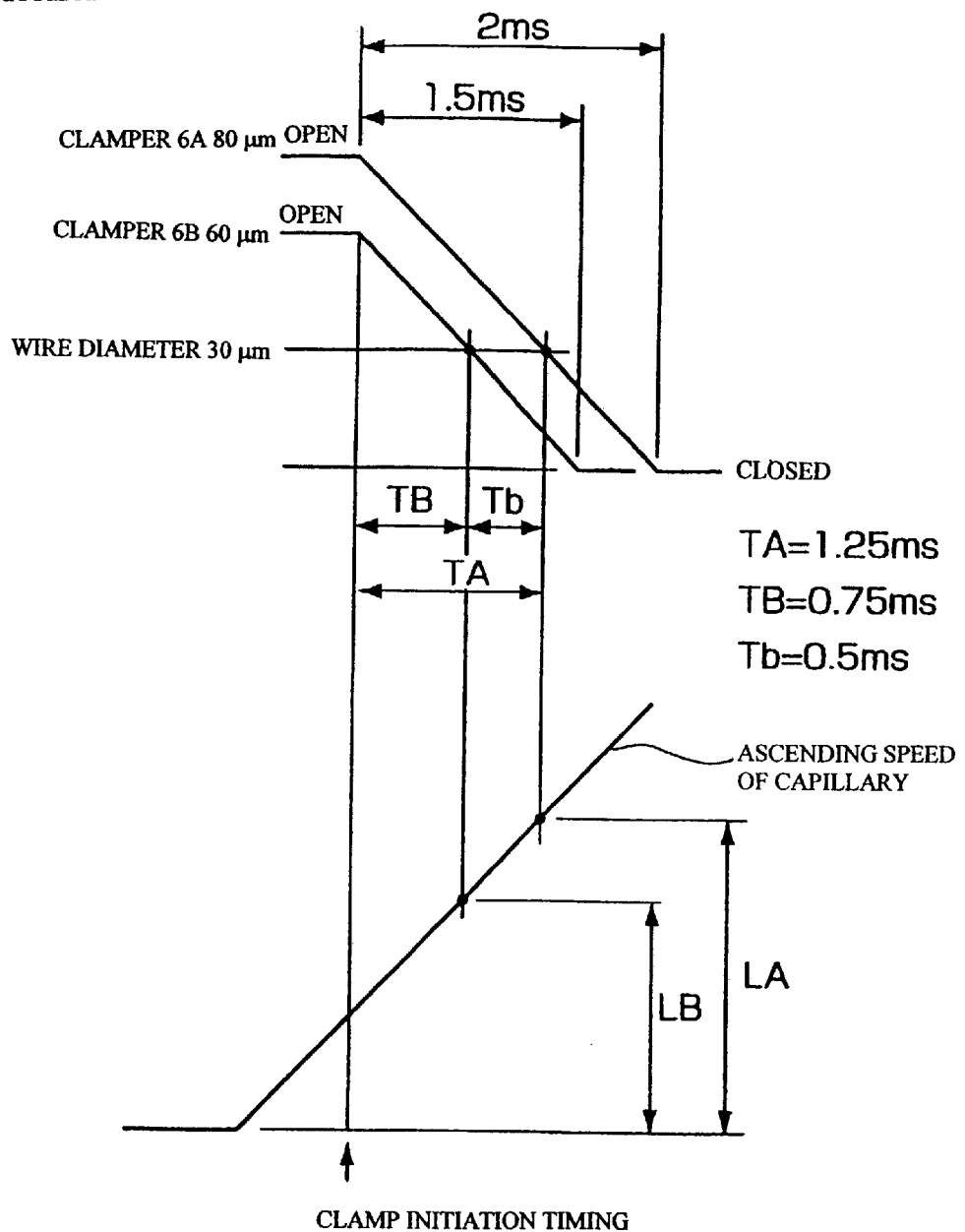
FIG. 6 is a diagram which illustrates the change in the tail length according to the amount of opening of the clamper.

The above-described procedure will be described in terms of concrete numerical values. In this description, the length of the tail 2b is measured by the above-described method illustrated in FIGS. 1 through 3; as shown in FIG. 6, the reference tail length of 360 $\mu$m is obtained at the design amount of opening of 80 $\mu$m in the case of the damper 6A; and a tail length of 324 $\mu$m is obtained in the case of the damper 6B. Thus, in order to obtain the reference tail length of 360 $\mu$m in the case of the damper 6B as well, the position (timing) at which the wire 2 is clamped by the damper 6 is corrected by the method described below.

Here, the amount by which the capillary 1 is raised per pulse as a result of the constant-speed operation of the capillary 1 in which S=72 $\mu$m/ms, i.e., the amount P, is 7.2 $\mu$m. The tail length in the case of the damper 6B is shorter than the reference tail length LA of 360 $\mu$m by $\Delta L=36$ $\mu$m as described above; accordingly, it is sufficient if holding or clamping is initiated at a position that is later (higher) than the reference clamp initiation timing for a tail length LA of 360 $\mu$m by an amount equal to $\Delta L=36$ $\mu$m. This clamp initiation correction time $\Delta T$ can be expressed as $\Delta T=\Delta L \div S=$ 36 $\mu$m$\div$72 $\mu$m/ms=0.5 ms. In other words, it is sufficient if the clamping is initiated 0.5 ms later than the reference clamp initiation timing.

In the above-described method, the speed at which the capillary 1 is raised and the closing speed at which the clamper 6 is closed are constant, thus the system has linear characteristics. In the actual movement, however, there is also a non-linear component, so that there may be cases in which a complete correction is not accomplished. In such cases, it is desirable to add a correction for the difference $\Delta L$ ($\mu$m) of the tail length determined by measuring the tail length by the above-described method, and to adjust the calculation formula of the computer 13 on the basis of data determined by experiment.

As seen from the above, according to the present invention, the capillary is moved to a measurement position above a tail length measuring member after the tail has been extended; the capillary is then lowered so that the tip end of the tail contacts the tail length measuring member, and the position of the capillary or the distance by which the capillary has been lowered at the time that electrical continuity is established with the tail length measuring member is detected; and then the tail length is calculated: from the height level of the tail length measuring member, the position of the capillary prior to the lowering of said capillary for the purpose of tail measurement, and the position of the capillary at the time that the wire contacts the tail length measuring member; or from the height of the capillary above the tail length measuring member prior to the lowering movement of the capillary for the purpose of tail measurement, and the distance by which the capillary is lowered. Accordingly, differences between individual dampers can be eliminated, and a stable tail length can be obtained without lowering the speed at which the capillary is raised.

What is claimed is:

1. A wire bonding method in which a wire is bonded to a second bonding point, a capillary is raised by a specified amount, then a damper is closed, and said capillary and said damper are raised together so that said wire is cut from a root portion of said second bonding point, thus causing a tail of said wire used for forming a ball to extend from a lower end of said capillary, said method comprising the steps of:

moving said capillary to a measurement position above a tail length measuring member after said tail has been extended, lowering said capillary so that a tip end of said tail contacts said tail length measuring member, then detecting a position of said capillary or a distance by which said capillary has been lowered, at a time that electrical continuity is established with said tail length measuring member, and calculating said tail length based upon:

(a) a height level of said tail length measuring member, a position of said capillary prior to lowering of said capillary for measuring said tail, and a position of said capillary at a time that said wire contacts said tail length measuring member, or (b) a height of said capillary above said tail length measuring member prior to lowering of said capillary for measuring said tail, and a distance by which said capillary is lowered.

2. The wire bonding method according to claim 1, wherein said tail length measuring member is an electric torch which is used to form said ball on said tail.

3. The wire bonding method according to claim 1, wherein said tail length measuring member is a semiconductor chip.

4. The wire bonding method according to claim 1, further comprising the step of correcting a clamp timing of said damper after said step of calculating said tail length.

5. The wire bonding method according to claim 4, wherein said step of correcting a clamp timing of said damper is performed according to a speed at which said capillary is raised at a time that said capillary is raised after bonding to said second bonding point and to a difference between a measured tail length and a reference tail length.

6. A wire bonding in which in which a wire is bonded to a second bonding point, a capillary is raised by a specified amount, then a damper is closed, and said capillary and said damper are raised together so that said wire is cut from a root portion of said second bonding point, thus causing a tail used for forming a ball to extend from a lower end of said capillary, said wire bonding apparatus comprising:

a micro-voltage application circuit which applies a micro-voltage to said wire, a contact detection section which outputs a detection signal when said capillary from which said tail has been extended is moved to a measurement position above a tail length measuring member and is then lowered so that a tip end of said tail contacts said tail length measuring member, and a computer which calculates said tail length based upon
(a) a height level of said tail length measuring member, a position of said capillary prior to lowering of said capillary for measuring said tail, and a position of said capillary at a time that said wire contacts said tail length measuring member, or (b) a height of said capillary above said tail length measuring member prior to lowering of said capillary for measuring said tail, and a distance by which said capillary is lowered.

7. The wire bonding apparatus according to claim 6, wherein said tail length measuring member is an electric torch which is used to form said ball on said tail.

8. The wire bonding apparatus according to claim 6, wherein said tail length measuring member is a semiconductor chip.

9. The wire bonding apparatus according to claim 6, said computer further calculates said tail length and corrects a clamp timing of said damper based upon said calculation.

10. The wire bonding method according to claim 9, wherein said correction of a clamp timing of said damper by said computer is performed according to a speed at which said capillary is raised at a time that said capillary is raised after bonding to said second bonding point and to a difference between a measured tail length and a reference tail length.

* * * * *